(12) United States Patent
Manholm et al.

(10) Patent No.: US 11,837,784 B2
(45) Date of Patent: Dec. 5, 2023

(54) METASURFACE ARRANGEMENT

(71) Applicant: Telefonaktiebolaget LM Ericsson (publ), Stockholm (SE)

(72) Inventors: Lars Manholm, Gothenburg (SE); Oscar Quevedo-Teruel, Stockholm (SE); David Gonzalez Gallardo, Gothenburg (SE); Astrid Algaba Brazalez, Gothenburg (SE); Martin Johansson, Mölndal (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 159 days.

(21) Appl. No.: 17/434,671

(22) PCT Filed: Mar. 1, 2019

(86) PCT No.: PCT/EP2019/055189
§ 371 (c)(1),
(2) Date: Aug. 27, 2021

(87) PCT Pub. No.: WO2020/177843
PCT Pub. Date: Sep. 10, 2020

(65) Prior Publication Data
US 2022/0173520 A1    Jun. 2, 2022

(51) Int. Cl.
*H01Q 15/00* (2006.01)
*H01Q 15/04* (2006.01)
*H01P 1/20* (2006.01)

(52) U.S. Cl.
CPC ....... *H01Q 15/0086* (2013.01); *H01P 1/2005* (2013.01); *H01Q 15/006* (2013.01); *H01Q 15/04* (2013.01)

(58) Field of Classification Search
CPC .. H01Q 15/0086; H01Q 15/04; H01Q 15/006; H01P 1/2005; H05K 1/0236; H05K 1/024
See application file for complete search history.

(56) References Cited

U.S. PATENT DOCUMENTS 7,250,835 B2 *   7/2007   Higgins  ................ H01P 1/2088
                                                  333/209
7,586,444 B2 *   9/2009   Berlin   ................ H01Q 15/0026
                                                  343/762
(Continued)

FOREIGN PATENT DOCUMENTS

CN         207353474 U   *   5/2018

OTHER PUBLICATIONS

International Search Report and Written Opinion of the International Searching Authority, PCT/EP2019/055189, dated Oct. 24, 2019, 11 pages.
(Continued)

*Primary Examiner* — Vibol Tan
(74) *Attorney, Agent, or Firm* — Sage Patent Group

(57) ABSTRACT

The present disclosure relates to a metasurface arrangement including a first metasurface and a second metasurface which run mutually parallel and face each other. Each metasurface includes a corresponding periodic or quasi-periodic structure formed in a respective pattern. The first metasurface is formed in a dielectric material structure and the second metasurface is formed in either a dielectric material structure or in an electrically conducting structure. The periodic or quasi-periodic structure on the first metasurface is configured to yield a first response to an incident electromagnetic wave between the two metasurfaces, and the periodic or quasi-periodic structure on the second metasurface is configured to yield a second response to the incident electromagnetic wave between the two metasurfaces that is equivalent to the first response, thereby rendering the two metasurfaces mutually electromagnetically symmetric.

19 Claims, 7 Drawing Sheets

(56) References Cited

U.S. PATENT DOCUMENTS

| | | | | |
|---|---|---|---|---|
| 8,013,777 B2* | 9/2011 | Sim | ................... | H01Q 17/00 |
| | | | | 342/4 |
| 8,816,798 B2* | 8/2014 | McKinzie, III | ........... | H01P 1/16 |
| | | | | 333/175 |
| 9,000,869 B2* | 4/2015 | McKinzie, III | ......... | H01P 1/163 |
| | | | | 333/175 |
| 9,362,601 B2* | 6/2016 | McKinzie, III | ...... | H05K 1/0236 |
| 2015/0171498 A1 | 6/2015 | McKinzie, III | | |

OTHER PUBLICATIONS

Quevedo-Teruel, O., et al., "Ultrawideband Metasurface Lenses Based On Off-Shifted Opposite Layers," IEEE Antennas and Wireless Propagation Letters, vol. 15, 2016, pp. 484-487.

Ebrahimpouri, M., et al., "Design Guidelines for Gap Waveguide Technology Based on Glide-Symmetric Holey Structures," Jun. 1, 2017, vol. 27, No. 6, (XP011652030) 3 pages.

Valerio, G., et al., "Suppressing and enhancing band gaps with glide-symmetric surfaces," 2017 International Conference on Electromagnetics in Advanced Applications (ICEAA), IEEE, Sep. 11, 2017, (XP033164296) pp. 1506-1508.

Quevedo-Teruel, O., et al., "Lens Antennas for 5G Communications Systems", Jul. 1, 2018, vol. 56, No. 7, (XP011687534) pp. 36-41.

* cited by examiner

METASURFACE ARRANGEMENT

CROSS REFERENCE TO RELATED APPLICATIONS

This application is a 35 U.S.C. § 371 national stage application of PCT International Application No. PCT/EP2019/055189 filed on Mar. 1, 2019, the disclosure and content of which is incorporated by reference herein in its entirety.

TECHNICAL FIELD

The present disclosure relates a metasurface arrangement comprising two metasurfaces facing each other, where microwave signals propagation between the metasurfaces is affected by the structure of the metasurfaces.

BACKGROUND

Metasurface technologies like gap waveguide or glide symmetry exhibit special electromagnetic properties that can be used in the design of low loss transmission lines, passive RF component like filters, antennas or power dividers. Application examples include removing leakage in waveguide joints via special pin-flanges or glide-symmetric holey flanges, and creating different types of antennas like slot arrays or lenses.

Symmetric metasurface structures can have two metasurfaces facing each other, being each other's mirror image when mirrored in the symmetry plane in the center between the two metasurfaces. Applying at the same time another type of symmetry, translation, along the symmetry plane, a type of higher symmetry, glide reflection symmetry, or glide symmetry for short, is achieved. Glide symmetric metasurfaces exhibit certain characteristics that for example make them particularly useful when designing EBGs or lenses.

Having two metasurfaces facing each other has previously been described in O. Quevedo-Teruel, M. Ebrahimpouri and M. Ng Mou Kehn, "Ultrawideband metasurface lenses based on off-shifted opposite layers," in IEEE Antennas and Wireless Propagation Letters, vol. 15, pp. 484-487, 2016. This document refers to metallic glide symmetric structures, and it is still desired to obtain a higher degree of freedom when designing metasurface structures facing each other, while enabling mirror-symmetry or glide symmetry.

SUMMARY

It is an object of the present disclosure to provide a metasurface structure, having two metasurfaces facing each other, that enable a higher degree of design freedom than previously known while enabling mirror-symmetry or glide symmetry, for example in dielectric or partly dielectric materials.

This object is obtained by means a of metasurface arrangement comprising a first and a second metasurface which run mutually parallel and face each other, each metasurface comprising a corresponding periodic or quasi-periodic structure formed in a respective pattern, wherein the first metasurface is formed in a dielectric material structure and the second metasurface is formed in either a dielectric material structure or in an electrically conducting structure, wherein the periodic or quasi-periodic structure on the first metasurface is configured to yield a first response to an incident electromagnetic wave between the two metasurfaces, and the periodic or quasi-periodic structure on the second metasurface is configured to yield a second response to the incident electromagnetic wave between the two metasurfaces that is equivalent to the first response, thereby rendering the two metasurfaces mutually electromagnetically symmetric.

This enables providing a metasurface structure, having two metasurfaces facing each other, where at least one metasurface is formed in a dielectric material structure. In this way, such a metasurface structure can be less expensive and complicated to manufacture while retaining the desired electric properties.

According to some aspects, there is a distance between the metasurfaces.

This enables forming a parallel plate waveguide (PPW) structure.

According to some aspects, the metasurfaces are formed in dielectric materials having the same conducting properties.

In this manner, a metasurface structure can be less expensive and complicated to manufacture while retaining the desired electric properties.

According to some aspects, the first metasurface is formed in a first material and the second metasurface is formed in a second material, where the first material and the second material have mutually different conducting properties.

This enables different materials to be used for the metasurfaces in a metasurface structure having two metasurfaces facing each other. This is for example useful for forming an Electromagnetic Band Gap (EBG) that can be used in to stop unwanted propagation in the interface between dissimilar materials, e.g. PCB and metal. For example, waveguide transitions between PCBs traditionally need good galvanic contact to avoid leakage. An EBG has an entire stop band, while for example a choke confers a single notch in the propagation characteristics.

According to some aspects, the first metasurface comprises a first periodic or quasi-periodic structure and the second metasurface comprises a second periodic or quasi-periodic structure, where each periodic or quasi-periodic structure is formed with mutually different geometries, rendering the two metasurfaces mutually electromagnetically symmetric.

This enables different materials to be used for the metasurfaces in a metasurface structure having two metasurfaces facing each other, while maintaining two mutually electromagnetically symmetric metasurfaces.

According to some aspects, each metasurface comprises a corresponding set of mutually identical electrically conducting structures that form the corresponding periodic or quasi-periodic structure.

According to some aspects, each periodic or quasi-periodic structure comprises electrically conducting structures.

According to some aspects, the electrically conducting structures comprise three-dimensional cavities.

According to some aspects, each three-dimensional cavity has a circular or a rectangular cross-section.

In this way, the periodic or quasi-periodic structure can easily be formed in a dielectric material structure.

According to some aspects, each cavity that is formed in a dielectric material structure comprises an electrically conducting bottom layer that is parallel to a main lateral extension of the dielectric material structure, and electrically conducting vias that run in the dielectric material structure and form a wall structure that runs perpendicular to the bottom layer.

In this way, the periodic or quasi-periodic structure can easily be formed in a dielectric material structure.

According to some aspects, the metasurfaces are positioned such that opposing electrically conducting structures face each other, providing mirror symmetry.

According to some aspects, the metasurfaces are positioned such that opposing electrically conducting structures are laterally displaced with respect to each other such that a glide-symmetric metasurface arrangement is formed.

This enables a larger bandwidth than traditional structures

This object is also obtained by means of methods that are associated with the above advantages.

BRIEF DESCRIPTION OF THE DRAWINGS

The present disclosure will now be described more in detail with reference to the appended drawings, where.

DETAILED DESCRIPTION

Figure 1A:
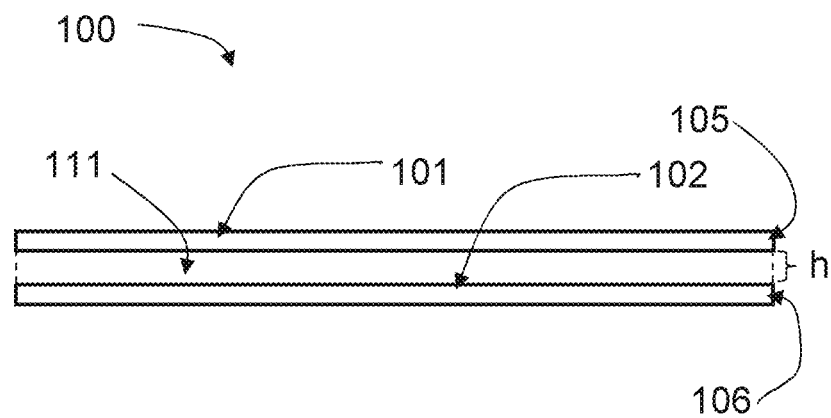
FIG. 1A schematically shows a side view of a parallel plate waveguide (PPW) structure.

Aspects of the present disclosure will now be described more fully hereinafter with reference to the accompanying drawings. The different devices, systems, computer programs and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Figure 1B:
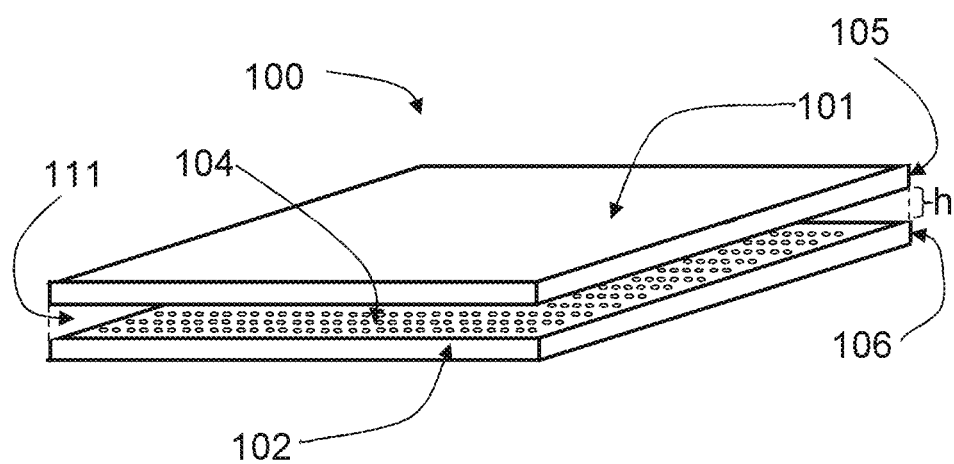
FIG. 1B schematically shows a perspective view of a PPW structure.
Figure 2A:
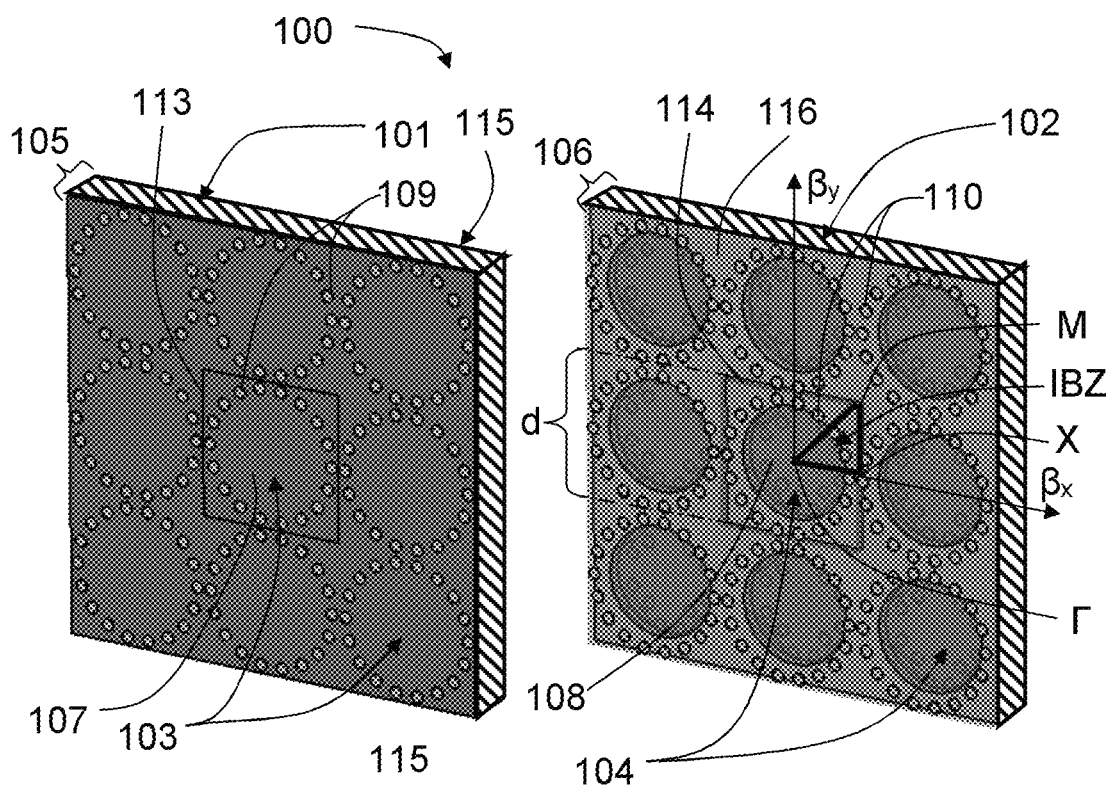
FIG. 2A schematically shows a perspective view of a first example of a metasurface arrangement.

With reference to FIG. 1A and FIG. 1B there is a metasurface arrangement 100 comprising a first metasurface 101 and a second metasurface 102 which run mutually parallel and face each other. With reference also to FIG. 2A, showing a partial perspective view of a first example of the two metasurfaces 101, 102, each metasurface 101, 102 comprises a plurality of electrically conducting structures 103, 104 that are formed in a respective first pattern and second pattern that according to some aspects is symmetric, periodically repeating, quasi-symmetric and/or periodically quasi-repeating. According to some aspects, at least a group of electrically conducting structures at one metasurface are in electrical contact with each other.

Here, the pattern is symmetric and periodically repeating in a periodic structure, each metasurface 101, 102 comprising a corresponding set of mutually identical electrically conducting structures 103, 104. According to some aspects, the metasurface arrangement 100 forms a parallel plate waveguide (PPW) structure.

According to some aspects, the first metasurface 101 and the second metasurface 102 are formed in a corresponding first dielectric material structure 105 and second dielectric material structure 106, each dielectric material structure 105, 106 having the same electric properties. Generally, a dielectric structure comprises one or more layers of one or more dielectric materials. According to some aspects, a dielectric structure additionally comprises one or more electrically conducting layers that can be constituted by layers of metal foil, as well as other added components such as vias. In this example the first dielectric material structure 105 is in the form of a first PCB (printed circuit board) structure and the second dielectric material structure 106 is in the form of a second PCB structure. The PCB structures 105, 106 are separated by a distance h, and between the PCB structures 105, 106 there is an intermediate dielectric material 112 that can be air or any other suitable type of dielectric material.

According to some aspects, in FIG. 2A, a mirror-symmetric structure is depicted for parts of the PCB structures 105, 106 that have a mutual similar structure. Here, the electrically conducting structures 103, 104 are in the form of three-dimensional cavities of circular form. Each cavity 103, 104 comprises an electrically conducting bottom metal layer 107, 108 that is parallel to a main lateral extension of the PCB structures 105, 106, and electrically conducting vias 109, 110 that run in the PCB structures 105, 106 and form a wall structure that runs perpendicular to the bottom metal 107, 108.

The bottom is formed in a corresponding bottom metal layer 107, 108 of each PCB structure 105, 106. For each PCB structure 105, 106, the electrically conducting vias 109, 110 run between, and electrically connect, the bottom metal layer 107, 108 and a corresponding top metal layer 115, 116. The top metal layers 115, 116 form opposing metal layers in the metasurface arrangement 100. Each cavity 103, 104 has an opening in the form of an etched circular aperture in the top metal layer 115, 116. The cavities form adjacent unit cells. For each PCB structure 105, 106, there is an imaginary square 113, 114 that depict a unit cell in each PCB structure 105, 106 and illustrate how the two metasurfaces 101, 102 will be positioned in relation to each other. In this example, it is evident that for a certain cavity 103, 104 there is a directly opposing cavity 104, 103.

Figure 2B:
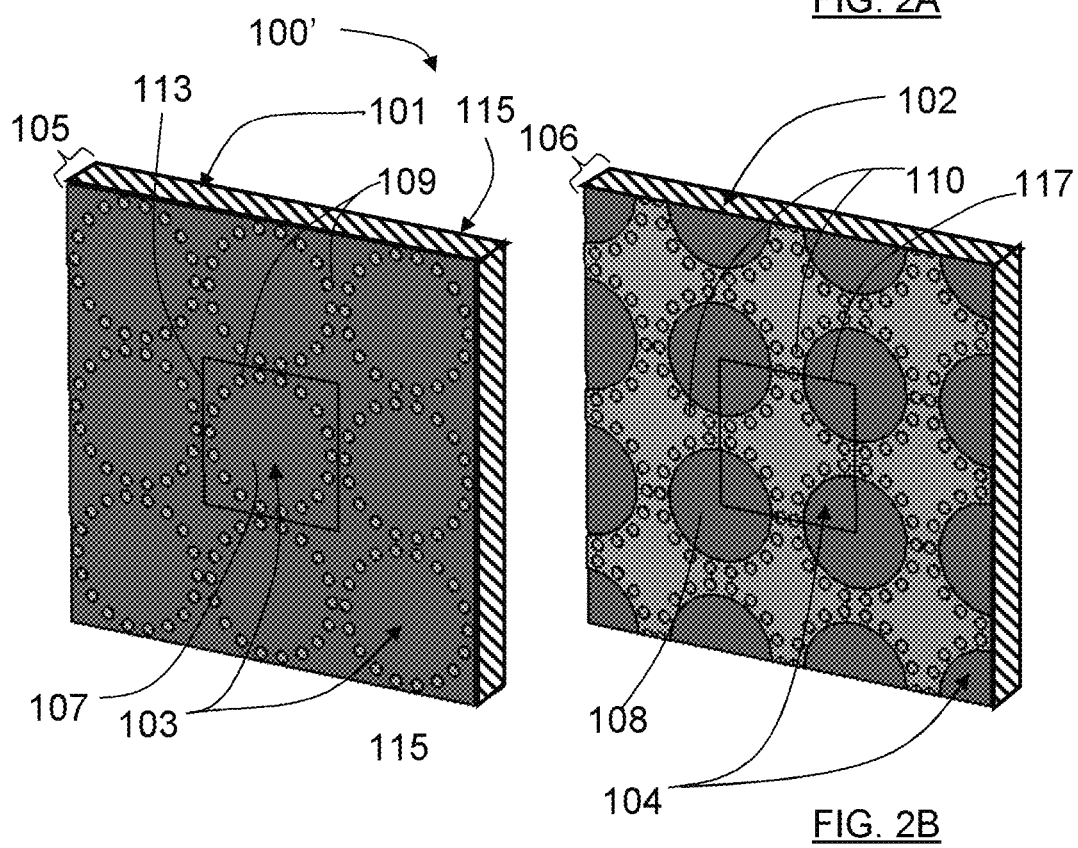
FIG. 2B schematically shows a perspective view of a second example of a metasurface arrangement.

In FIG. 2B, showing a second example, there is a similar metasurface arrangement 100' comprising two metasurfaces 101, 102 in corresponding PCB structures 105, 106. Here, however, a glide symmetric structure is depicted since the PCB structures 105, 106 are offset half a unit cell compared to the first example, as visualized by means of imaginary squares 113, 117 that depict the position of a unit cell of the first PCB structure 105, illustrating how the two metasurfaces 101, 102 will be positioned in relation to each other.

Figure 3A:
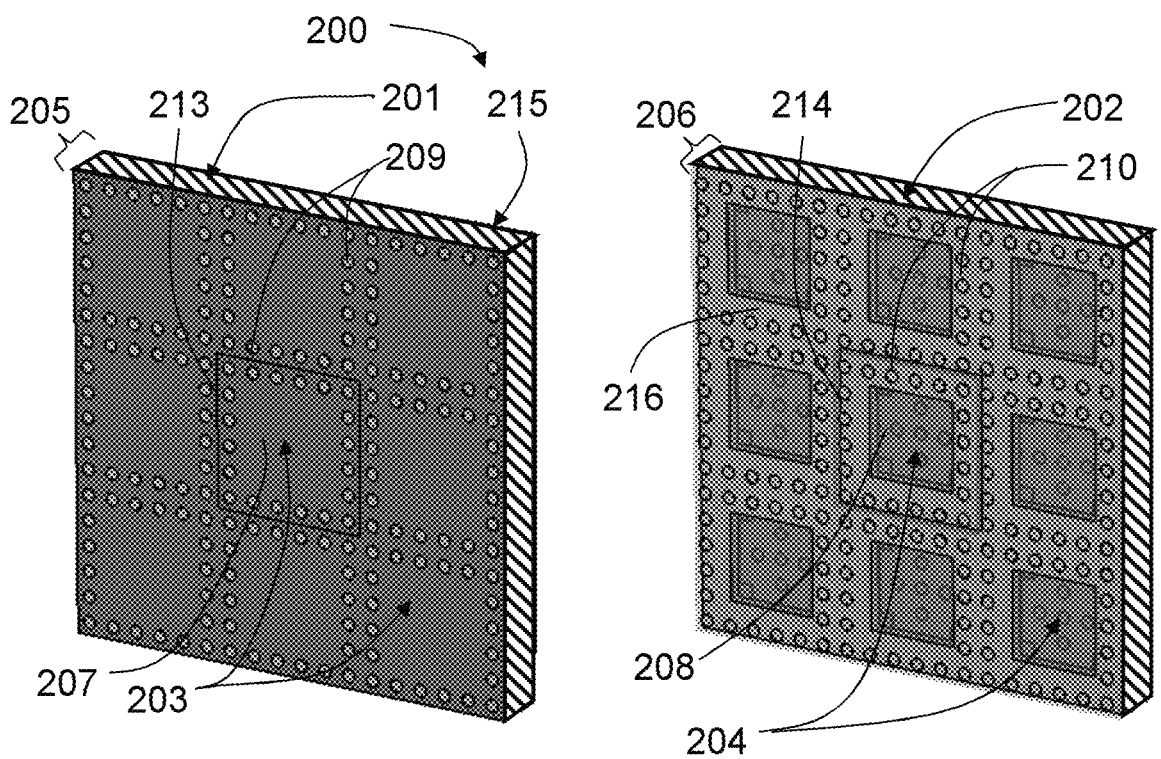
FIG. 3A schematically shows a perspective view of a third example of a metasurface arrangement.
Figure 3B:
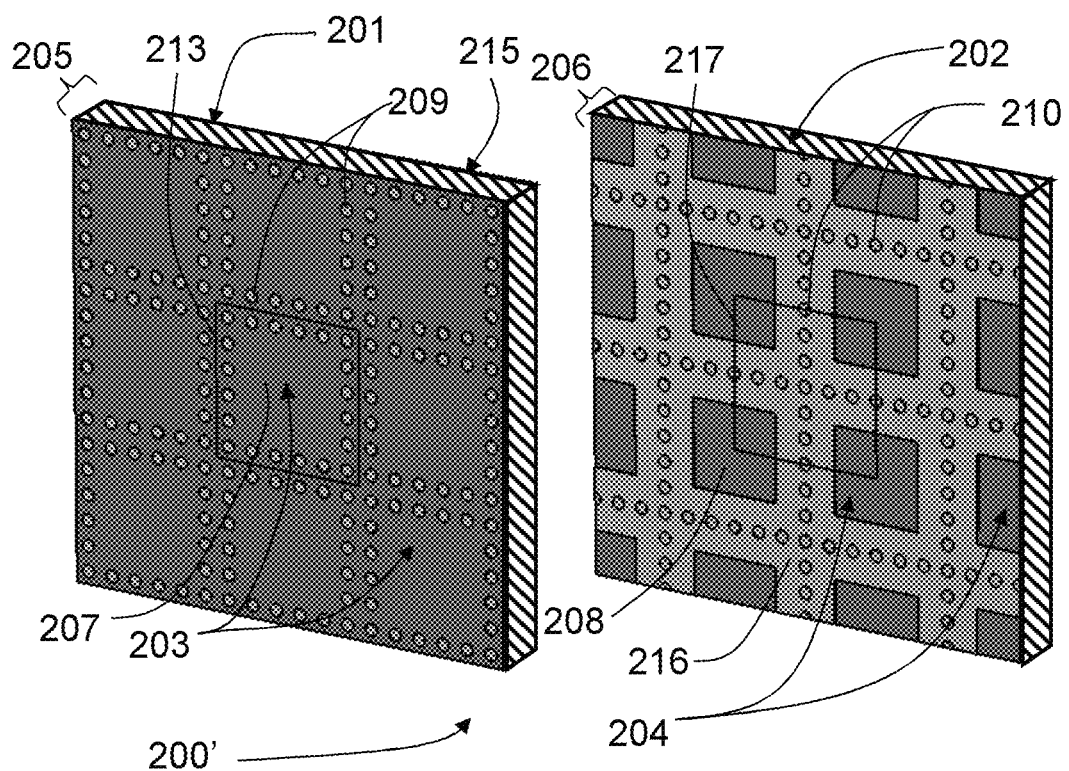
FIG. 3B schematically shows a perspective view of a fourth example of a metasurface arrangement.

With reference to FIG. 3A and FIG. 3B, each three-dimensional cavity 203, 204 has a rectangular cross-section, otherwise the general structure is similar to the one in the previous examples. More in detail, in FIG. 3A that shows a third example that corresponds to the first example, a mirror-symmetric metasurface arrangement 200 is depicted for parts of PCB structures 205, 206 that have a mutual similar structure. I the same way as in the first example, each cavity 203, 204 comprises a corresponding electrically conducting bottom metal 207, 208 and electrically conducting vias 209, 210 run in the PCB structures 205, 206 forming wall structures by running between, and electrically connecting, the bottom metal layer 207, 208 and a corresponding top metal layer 215, 216.

The bottom is formed in the bottom metal layer 207, 208 of each PCB structure 205, 206. For each PCB structure 205, 206, the electrically conducting vias 209, 210 run between, and electrically connect, the bottom metal layer 207, 208 and a corresponding top metal layer 215, 216 as in the first example. Each cavity 203, 204 has an opening in the form of an etched rectangular aperture in the top metal layer 215, 216. The cavities form adjacent unit cells. For each PCB structure 205, 206, there is an imaginary square 213, 214 that depict a unit cell in each PCB structure 205, 206 and illustrate how the two metasurfaces 201, 202 will be positioned in relation to each other. In this example, it is evident that for a certain cavity 203, 204 there is a directly opposing cavity 204, 203.

In FIG. 3B, showing a fourth example that corresponds to the second example, there is a similar metasurface arrangement 200' comprising two metasurfaces 201, 202 in corresponding PCB structures 205, 206. Here, however, a glide symmetric structure is depicted since the PCB structures 205, 206 are offset half a unit cell compared to the first example, as visualized by means of imaginary squares 213, 217 that depict the position of a unit cell of the first PCB structure 205, illustrating how the two metasurfaces 201, 202 will be positioned in relation to each other.

Figure 5:
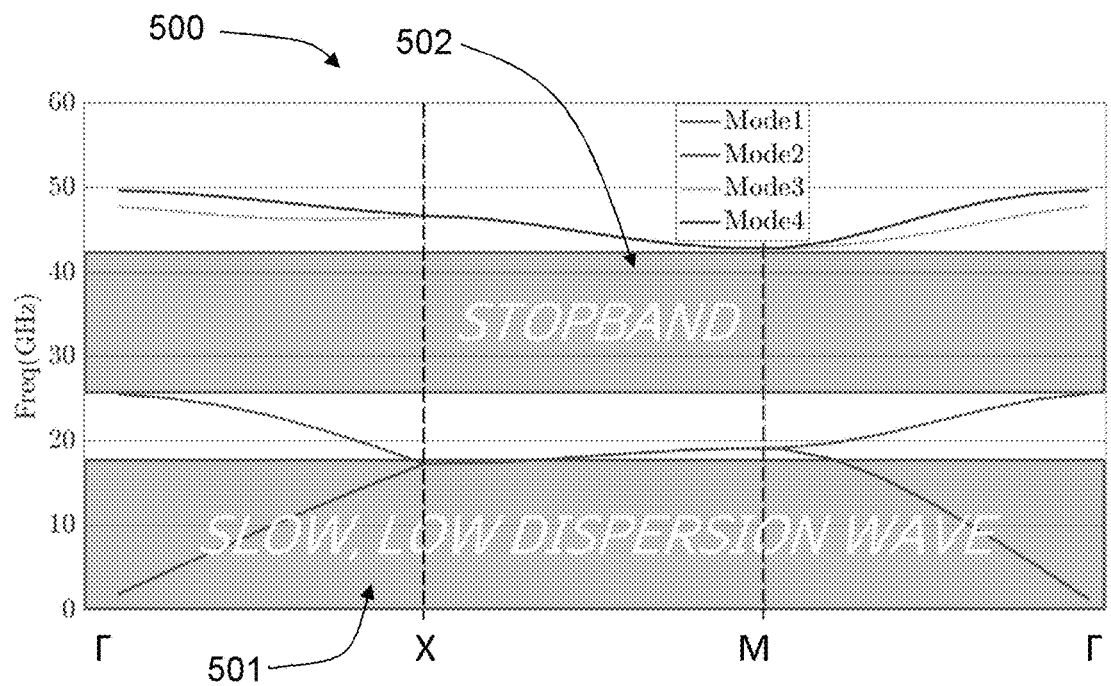
FIG. 5 shows an example of a typical dispersion diagram.

In one mode of operation, the metasurface structures 100, 100', 200, 200' described can be used to modify the speed of propagation of a wave travelling in the gap between the metasurfaces in the so-called "slow wave" region 501 of a dispersion diagram; an example of a typical dispersion diagram 500 for an EBG structure is shown in FIG. 5.

The propagation characteristics of a periodic structure can be characterized by solving the eigenmode problem for its unit cell, using periodic boundary conditions with a phase difference between the boundaries of the unit cell. The phase constant in x (y)-direction is denoted $\beta_x$ ($\beta_y$) and thus the phase difference in x (y)-direction becomes $\beta_x d_x$ ($\beta_y d_y$) where $d_x$ ($d_y$) is the length of the unit cell in x (y). The frequencies of each eigenmode can be plotted as a function of the phase constants $\beta_x$ and $\beta_y$, producing what is known as a dispersion diagram.

It is sufficient to solve the eigenmode problem only for combinations of $\beta_x$ and $\beta_y$ that lie on the contour of the Irreducible Brillouin Zone (IBZ), which in this specific case is defined by the corner points Γ, X and M. At point Γ, $\beta_x=\beta_y=0$, at point X, $\beta_x=\pi/d$ and $\beta_y=0$ and at point M, $\beta_x=\beta_y=\pi/d$, where $d=d_x=d_y$ is the length of the unit cell for the square lattice, and is shown for one side of the imaginary square 114 in FIG. 2B, constituting a unit cell square.

If, for a specific unit cell, there does not exist any eigenmodes for a given frequency for any combination of $\beta_x$ and $\beta_y$ that lie on the IBZ contour, then there is no mode that propagates at any direction in that specific periodic structure. Therefore, the dispersion diagram shows only the eigenmode frequencies for the one-dimensional contour Γ-X-M-Γ, not the full $\beta_x$-$\beta_y$ space.

With the speed of propagation easily controlled by changing the geometry of each metasurface pattern, i.e. the pattern of electrically conducting structures 103, 104; 203, 204; 303, 304, different components that utilize this phenomenon can be made, e.g. PPW gradient index lenses or phase shifters. The low dispersion characteristics in this region, i.e. the near linear increase of propagation constant with frequency, of glide symmetric structures makes such PPW components very wideband.

In another mode of operation, a metasurface PPW can stop all propagation within a certain frequency band, the "stop band" or EBG region 502 shown in FIG. 5. This feature can be used in e.g. RF interconnects between PCBs not requiring perfect galvanic contact. The RF interconnect between two separate PCB could e.g. be a rectangular waveguide joint with the waveguides in the perpendicular direction from the PCB surfaces. The waveguide joint is surrounded by the proposed EBG structure, stopping the propagation in any unintentional gap between the PCBs.

To summarize, a metasurface arrangement is according to the four examples above formed by etched patterns in two PCBs facing each other with a gap h between them, for example forming a PPW structure. The gap h can be filled with any dielectric, for example air in order to reduce losses. Depending of the mode of operation, the metasurface structure can be used for controlling the propagation velocity in PPWs, or for stopping unwanted leakage in the gap between two PCBs.

A number of advantages are presented by means of the above. For example:
  Easier manufacturing is provided by means of etched PCBs compared to metal structures that for example require CNC milling or drilling in metal.
  Using air as a dielectric in a PPW gap provides lower losses for wave propagation than other PCB metasurface or lens structures with the wave propagating in dielectric.
  Glide symmetric metasurface arrangements, when used for lensing, gives lower dispersion and wider bandwidth compared with having a metasurface on only one of the surfaces in the parallel plate structure.
  Glide symmetric structures can be used to form an EBG to stop unwanted leakage in the gap between two PCBs, avoiding the need of perfect galvanic contact.

Figure 4A:
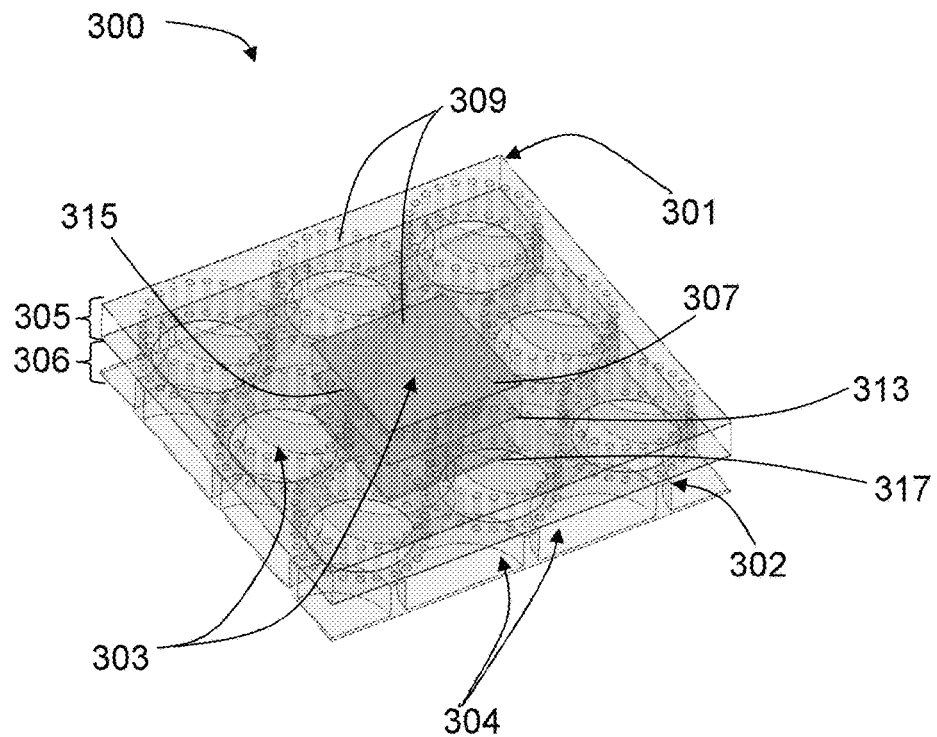
FIG. 4A schematically shows a perspective view of a fifth example of a metasurface arrangement.
Figure 4B:
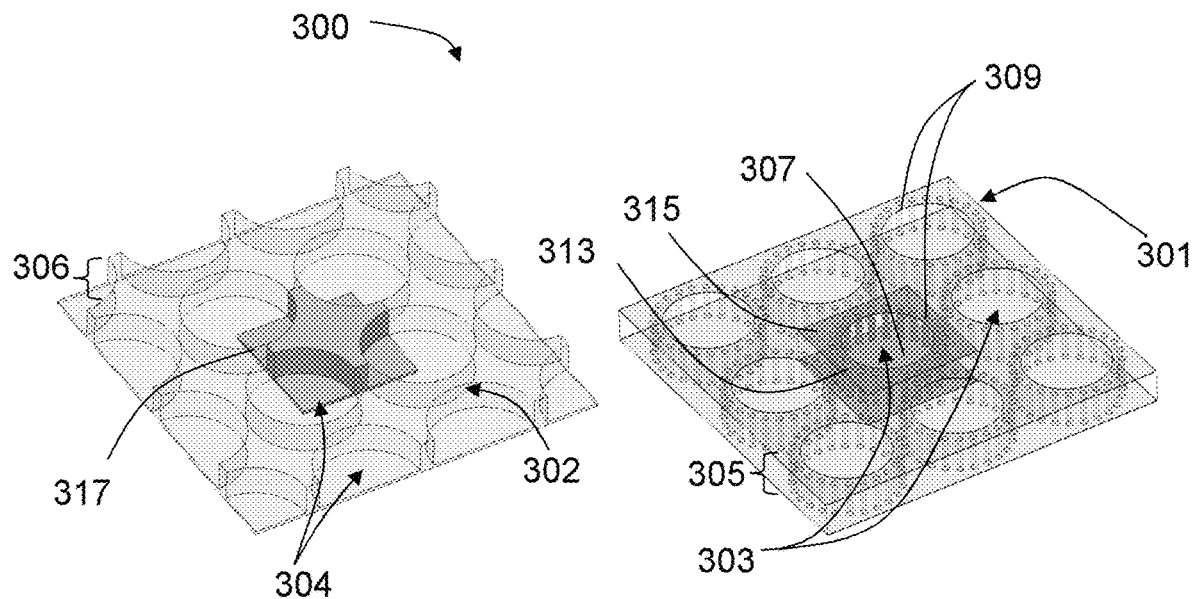
FIG. 4B schematically shows a perspective view of the fifth example of a metasurface arrangement.

According to some aspects, according to a fifth example with reference to FIG. 4A and FIG. 4B, there is a metasurface arrangement 300 comprising a first metasurface 301 and a second metasurface 302. In FIG. 4A the two metasurfaces 301, 302 are facing each other, and in FIG. 4B the two metasurfaces are shown side by side. Generally, the first metasurface 301 is formed in a first material and the second metasurface 302 is formed in a second material, where the first material and the second material have mutually different electric properties. In this example, the first metasurface 301 is formed in a dielectric material structure such a as a PCB having a PCB structure 305 that is the same as described for the first example and the second example. The first metasurface 301 comprises a plurality of cavities 303, each cavity 303 comprises an electrically conducting bottom metal layer 307 and electrically conducting vias 309 that run in the PCB structure 305 forming wall structures by running between, and electrically connecting, the bottom metal layer 307 and a corresponding top metal layer 315.

The second metasurface 302 is formed in metal such that a metal structure 306 is formed having a plurality of circular cavities 304. Here, a glide symmetric structure is depicted since the metasurfaces 301, 302 are offset half a unit cell, as visualized by means of imaginary squares 313, 317 that depict the position of a unit cell of the first metasurface 301, here constituted by the PCB structure 305, illustrating how the two metasurfaces 301, 302 will be positioned in relation to each other. Mirror symmetry is for example of course also conceivable.

Since the metasurfaces 301, 302 are formed in different materials, having mutually different electric properties, the cavities 303, 304 for each metasurface 301, 302 are formed such that the electric properties for an incident electromagnetic signals that is to propagate between the two metasurfaces 301, 302 experiences the same electric properties as if the metasurfaces 301, 302 would have been made in one and the same material as in the first two examples. This is accomplished by careful design of the cavities 303 in the first metasurface 301 and the cavities 304 in the second metasurface 302 such that the respective cavities 303, 304 of opposing metasurfaces 301, 302 match each other in order to provide the desired electric characteristics.

Such a metasurface arrangement 300 can be regarded as a symmetry-mimicking metasurface arrangement, where the electromagnetic characteristics of a symmetric metasurface are mimicked in a structure that has different materials and geometries in the two symmetry halves that are constituted by the two metasurfaces 301, 302. From an electromagnetic point of view, the actual material properties and inner geometry of the bodies composing the metasurfaces 301, 302 is irrelevant, as long as the electromagnetic response to a stimulus is identical. If the response to an incident wave is equivalent to the true geometrically symmetric case, the metasurface arrangement 300 will work as a geometrically symmetric structure being constituted by two similar metasurfaces as in the first four examples, and the fields inside the cavities 303, 304 in the two metasurfaces 301, 302 do not have to be identical. This follows from the equivalence principle in electromagnetic theory. The two metasurfaces 301, 302 of the symmetric metasurface arrangement 300 can thus be made differently, with different materials and different geometries, as long as the fields on the metasurfaces 301, 302 are symmetric.

This means that periodic or quasi-periodic structure in the form of the apertures 303 on the first metasurface 301 is configured to yield a first response to an incident electromagnetic wave between the two metasurfaces 301, 302, and the periodic or quasi-periodic structure in the form of the apertures 304 on the second metasurface 302 is configured to yield a second response to the incident electromagnetic wave between the two metasurfaces 301, 302 that is equivalent to the first response, thereby rendering the two metasurfaces 301, 302 mutually electromagnetically symmetric. Each periodic or quasi-periodic structure 303, 304 is formed with mutually different geometries, rendering the two metasurfaces 301, 302 mutually electromagnetically symmetric. In this way, the properties of the propagating and reflecting waves can be controlled.

The two metasurfaces 101, 201; 102, 202 are mutually electromagnetically symmetric for the four first examples as well, since the metasurfaces 101, 102; 201, 202 there are formed in dielectric materials having the same electric properties.

Electromagnetic mimicking means to resemble the electromagnetic properties of a given structure. In this specific case mimicking means that a metasurface resembles the electromagnetic properties of another metasurface which is geometrically different. Therefore, although both metasurfaces are geometrically different, they produce a similar response. In this sense, both metasurfaces can be coupled to produce mimicked glide symmetry. The combination of both will be a mimicked glide-symmetric metasurface.

Figure 6:
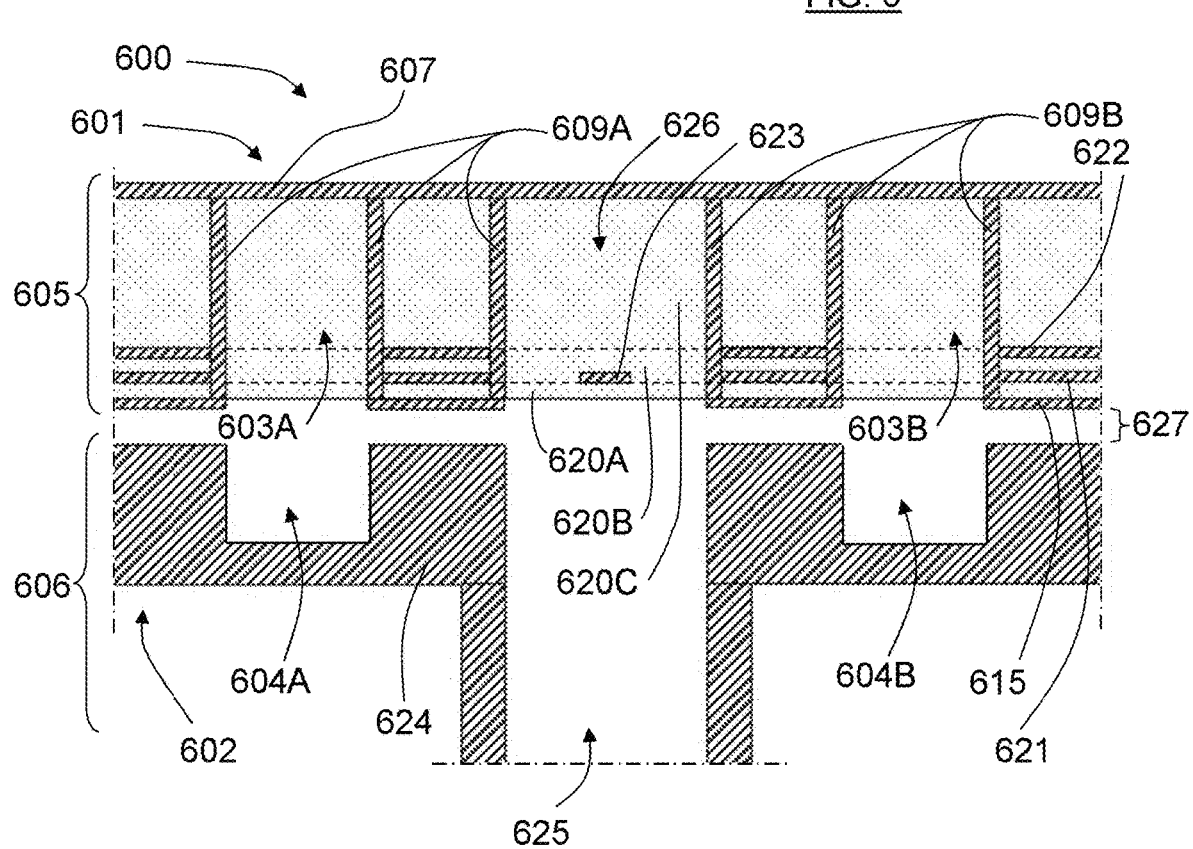
FIG. 6 schematically shows a perspective view of a waveguide interface according to a first application example.

A first application example of the present disclosure relates to stopping leakage in a waveguide interface between a PCB and a metal waveguide, see FIG. 6 that shows a sectional view of such an interface.

Here, there is a metasurface arrangement 600 comprising a first metasurface 601 and a second metasurface 602, where the two metasurfaces 601, 602 are facing each other. The first metasurface 601 is formed in a dielectric material structure such a as a PCB having a PCB structure 605 that comprises a first dielectric layer 620A, a second dielectric layer 620B and a third dielectric layer 620C. The second metasurface 602 is formed in a metal structure 606, where the metal structure comprises a waveguide flange 624 and a waveguide conductor 625.

The first dielectric layer 620A comprises a top metal layer 615 and the third dielectric layer 620C comprises an electrically conducting bottom metal layer 607. The first dielectric layer 620A and the second dielectric layer 620B are separated by a first intermediate metal layer 621, and the second dielectric layer 620B and the third dielectric layer 620C are separated by a second intermediate metal layer 622. In the first intermediate metal layer 621, a stripline conductor 623 is formed. The stripline conductor 623 is adapted to conduct microwave signals to and from the waveguide conductor 625. Between the stripline conductor 623 and the bottom metal layer 607 a cavity back short is formed, such that a working signal transition between the stripline conductor 623 and the waveguide conductor 625 is obtained in a previously well-known manner.

The first metasurface 601 comprises a plurality of cavities 603A, 603B, each cavity 603A, 603B comprising a bottom formed in the bottom metal layer 607, and electrically conducting vias 609A, 609B that run in the PCB structure 605 forming wall structures by running between, and electrically connecting, the bottom metal layer 607 and the top metal layer 615.

The second metasurface 602 comprises a plurality of circular cavities 604A, 604B; in this schematical sectional view, only two corresponding cavities 603A, 604A; 603A, 603B are shown, preferably one or more rows of cavities circumvent the back short 626 and the waveguide conductor 625. The metasurfaces 601, 602 and their cavities are facing each other in a manner similar as shown in FIG. 4A, although FIG. 4A depicts glide symmetry. According to some aspects, the metasurface arrangement 600 provides an EBG structure.

Without the EBG structure, it is critical to have good electric contact between the top metal layer 615 and the metallic waveguide structure 606 to prevent leakage. By introducing an EBG structure around the transition by means of the metasurfaces 601, 602, undesired signal propagation in a gap 627 formed between the top metal layer 615 and the metallic waveguide structure 606 due to imperfect contact can be significantly attenuated, at least in the band stop frequency band 502 of the EBG, see FIG. 5.

In FIG. 6, a mirror symmetric structure is formed. Glide symmetry is for example of course also conceivable. A glide-symmetric holey metasurface structure can have a wide stop band when used as an EBG, and is thus an attractive EBG structure for this application. However, since one side of the gap is metal and the other is PCB, true glide symmetry cannot easily be achieved, and thus the symmetry-mimicking described above is applied. By proper design of apertures backed with cavities in the PCB, the electromagnetic response of these apertures can mimic that of the aperture structure in the metal, thus forming a glide-symmetry mimicking EBG structure.

A number of advantages are presented by means of the first application example above. For example:
  An EBG can be used to stop unwanted propagation in the interface between dissimilar materials, e.g. PCB and metal.
  An EBG has an entire stop band, while a choke has a single notch in the propagation.

Figure 7:
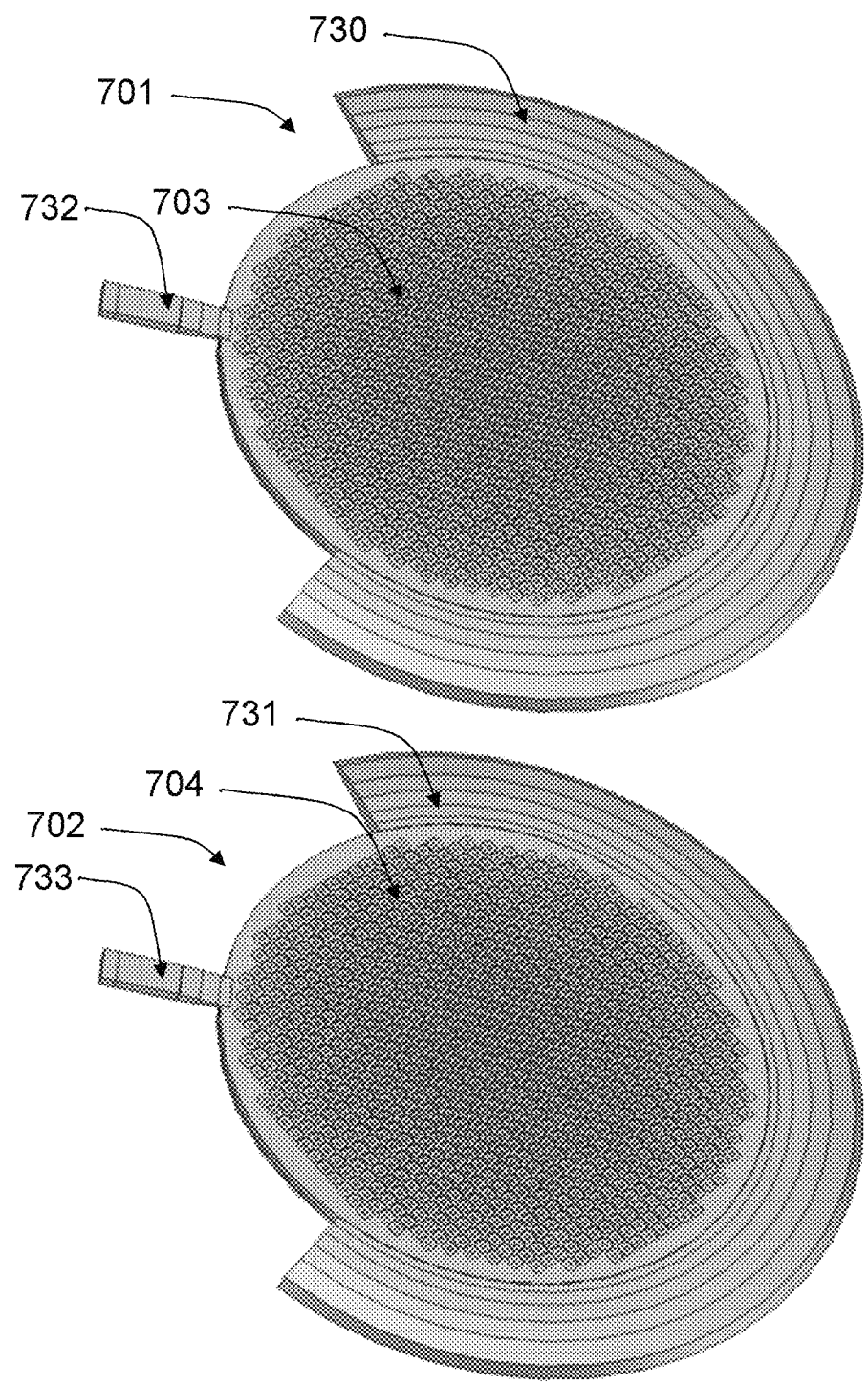
FIG. 7 schematically shows a perspective view of metasurfaces intended to form a lens arrangement according to a second application example.
Figure 8:
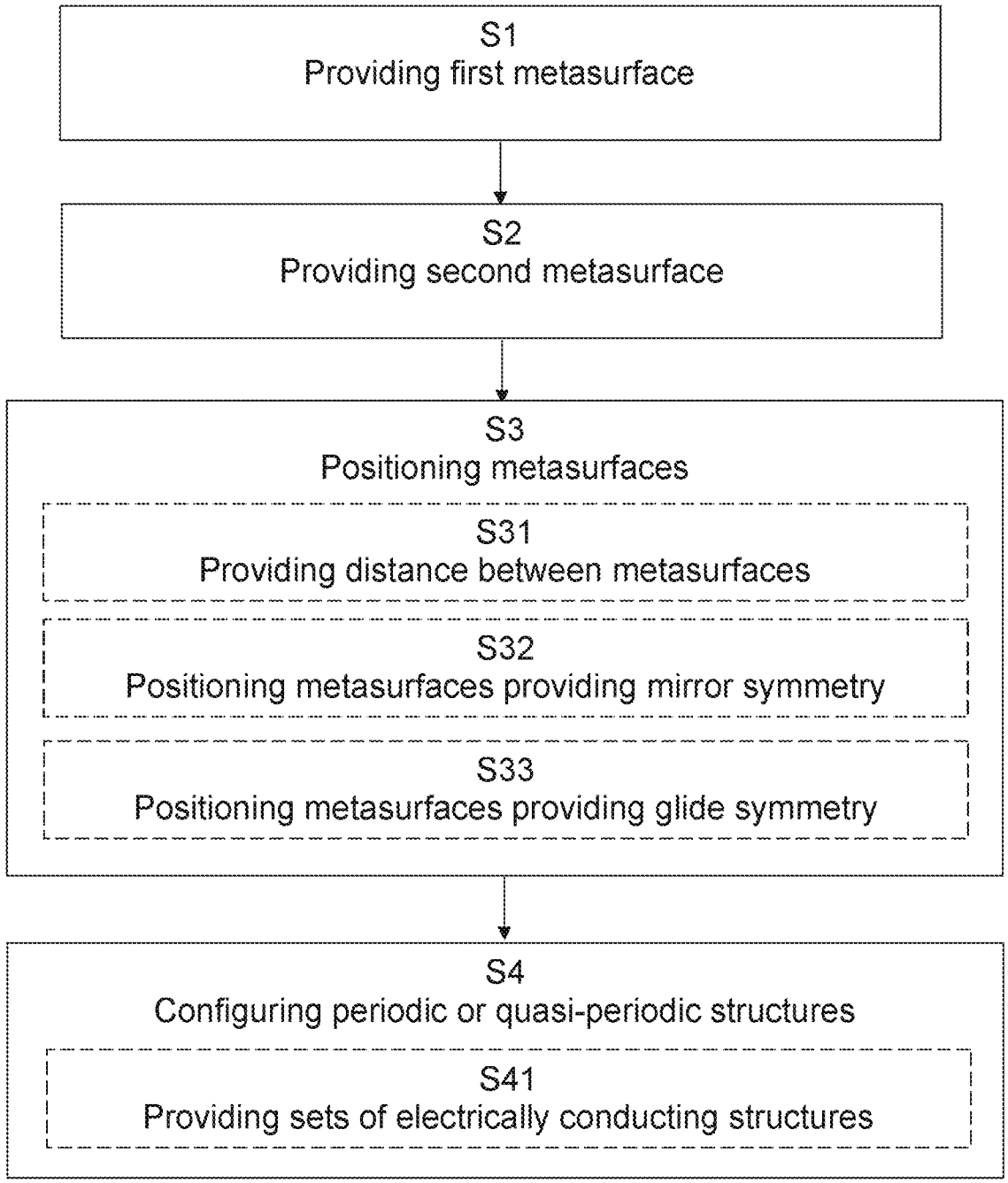
FIG. 8 shows flowcharts of methods according to embodiments.

A second application example of the present disclosure relates to metasurface lenses where the effective refractive index for a wave propagating in the gap between two symmetric metasurfaces can be controlled by the metasurface structures. This illustrated in FIG. 7 where there is a first metasurface 701 and a second metasurface 702, each metasurface comprising a corresponding periodic or quasi-periodic structure 703, 704 formed in a respective pattern. When these metasurfaces 701, 702 that are shown side by side in FIG. 7 are arranged to face each other, a metasurface lens is obtained. Each metasurface 701, 702 comprises a corresponding flare part 730, 731 and feeding arrangement 732, 733; these are previously well-known in the art of microwave lenses.

By employing glide symmetry, the lens can be made more wideband and less dispersive compared to without glide symmetry. Using the arrangement according to the fifth example, the two metasurfaces 701, 702 constituting the metasurface lens can be made dissimilar, e.g. with different materials and geometries, while maintaining the properties of true glide or mirror symmetry by means of mimicking. In this case, the first metasurface 701 is formed in a first material and the second metasurface 702 is formed in a second material, where the first material and the second material have mutually different conducting properties. The first material can for example be metal structure and the second material can be a PCB structure.

A number of advantages are presented by means of the second application example above. For example:
  Low dispersion, leading to wide band.
  Low loss.
  Ease of fabrication for example in PCB.

According to some aspects, a metasurface arrangement according to the fifth example above is adapted to electromagnetically mimic a symmetric metasurface where true symmetry cannot be achieved due to different materials in the two metasurface parts. For example, the beneficial electromagnetic characteristics of true glide symmetry can be obtained even though true glide symmetry cannot be achieved.

For all examples, although glide symmetry is described as suitable for high-performing EBG or lens structures, any kind of symmetry can be sued for the examples of the present disclosure, for example mirror or reflection symmetry and possibly twist symmetry.

Each metasurface is formed in a structure such as PCB structure or a metal structure, and is generally constituted by a metasurface structure.

Each periodic or quasi-periodic structure is formed in a respective pattern, according to some aspects patches of different shapes, strips for unidirectional propagating applications, or holes with or without backing cavities inside a PCB.

The electrically conducting bottom metal layer 107, 108; 207, 208; 307 is generally constituted by an electrically conducting bottom layer 107, 108; 207, 208; 307.

Terms such as equivalent and symmetric are not to be interpreted as mathematically exact, but within what is practically obtainable in this field of technology in order to obtain the desired technical effects.

Generally, the present disclosure also relates to a method for providing a metasurface arrangement, the method comprising providing S1 a first metasurface 101, 201, 301 by providing a first periodic or quasi-periodic structure 103, 203,303 in a first pattern in a dielectric material, providing S2 a second metasurface 102, 202, 302 by providing a second periodic or quasi-periodic structure 104, 204,304 in a second pattern in either a dielectric material or a metallic material, and positioning S3 the metasurfaces 101, 102; 201, 202; 301, 302 such that they run mutually parallel and face each other. The method further comprises configuring S4 the corresponding periodic or quasi-periodic structure 103, 104; 203, 204; 303, 304 formed in a respective pattern for each metasurface 101, 102; 201, 202; 301, 302 such that a first response to an incident electromagnetic wave between the two metasurfaces 101, 102; 201, 202; 301, 302 is obtained for the first metasurface 101, 201, 301, and a second response to the incident electromagnetic wave between the two metasurfaces 101, 102; 201, 202; 301, 302 is obtained for the second metasurface 102, 202, 302. The second response is equivalent to the first response, thereby rendering the two metasurfaces 101, 102; 201, 202; 301, 302 mutually electromagnetically symmetric.

According to some aspects, positioning S3 the metasurfaces comprises providing S31 a distance h between the metasurfaces 101, 102.

According to some aspects, the metasurfaces 101, 102; 201, 202; 301 are formed in dielectric materials having the same conducting properties.

According to some aspects, the first metasurface 301 is formed in a first material and the second metasurface 302 is formed in a second material, where the first material and the second material have mutually different conducting properties.

According to some aspects, each periodic or quasi-periodic structure is formed with mutually different geometries, rendering the two metasurfaces 301, 302 mutually electromagnetically symmetric.

According to some aspects, configuring S4 a corresponding periodic or quasi-periodic structure 103, 104; 203, 204; 303, 304 comprises providing S41, for each metasurface 101, 102; 201, 202; 301, 302, a corresponding set of mutually identical electrically conducting structures 103, 104; 203, 204; 303, 304.

According to some aspects, the electrically conducting structures 103, 104; 203, 204; 303, 304 are in the form of three-dimensional cavities.

According to some aspects, each three-dimensional cavity 103, 104; 203, 204; 303, 304 has a circular or a rectangular cross-section.

According to some aspects, positioning S3 the metasurfaces 101, 102; 201, 202 comprises positioning S32 the metasurfaces 101, 102; 201, 202 such that opposing electrically conducting structures 103, 104; 203, 204 face each other, providing mirror symmetry.

According to some aspects, positioning S3 the metasurfaces 101, 102; 201, 202; 301, 302 comprises positioning S33 the metasurfaces 101, 102; 201, 202; 301, 302 such that opposing electrically conducting structures 103, 104; 203, 204; 303, 304 are laterally displaced with respect to each other such that a glide-symmetric metasurface arrangement 100', 200', 300 is formed.

Generally the present disclosure also relates to a metasurface arrangement 100, 200, 300 comprising a first metasurface 101, 201, 301 and a second metasurface 102, 202, 302 which run mutually parallel and face each other. Each metasurface 101, 102; 201, 202; 301, 302 comprises a corresponding periodic or quasi-periodic structure 103, 104; 203, 204; 303, 304 formed in a respective pattern, wherein the first metasurface 101, 201, 301 is formed in a dielectric material structure 105, 205, 305 and the second metasurface is formed in either a dielectric material structure 106, 206 or in an electrically conducting structure 306. The periodic or quasi-periodic structure 103; 203; 303 on the first metasurface 101, 201, 301 is configured to yield a first response to an incident electromagnetic wave between the two metasurfaces 101, 102; 201, 202; 301, 302, and the periodic or quasi-periodic structure 104; 205; 306 on the second metasurface 102, 202, 302 is configured to yield a second response to the incident electromagnetic wave between the two metasurfaces 101, 102; 201, 202; 301, 302. The second response is equivalent to the first response, thereby rendering the two metasurfaces 101, 102; 201, 202; 301, 302 mutually electromagnetically symmetric.

According to some aspects, there is a distance h between the metasurfaces 101, 102.

According to some aspects, the metasurfaces 101, 102; 201, 202; 301 are formed in dielectric materials having the same conducting properties.

According to some aspects, the first metasurface 301 is formed in a first material and the second metasurface 302 is formed in a second material, where the first material and the second material have mutually different conducting properties.

According to some aspects, the first metasurface 301 comprises a first periodic or quasi-periodic structure 303 and the second metasurface 302 comprises a second periodic or quasi-periodic structure 304, where each periodic or quasi-periodic structure is formed with mutually different geometries, rendering the two metasurfaces 301, 302 mutually electromagnetically symmetric.

According to some aspects, each metasurface 101, 102; 201, 202; 301, 302 comprises a corresponding set of mutually identical electrically conducting structures 103, 104; 203, 204; 303, 304 that form the corresponding periodic or quasi-periodic structure.

According to some aspects, each periodic or quasi-periodic structure 103; 203; 303 103, 104; 203, 204; 303, 304 comprises electrically conducting structures.

According to some aspects, the electrically conducting structures comprise three-dimensional cavities.

According to some aspects, each three-dimensional cavity 103, 104; 203, 204; 303, 304 has a circular or a rectangular cross-section.

According to some aspects, each cavity 103, 104; 203, 204; 303 that is formed in a dielectric material structure 105, 106; 205, 206; 305 comprises an electrically conducting bottom layer 107, 108; 207, 208; 307 that is parallel to a main lateral extension of the dielectric material structures 105, 106; 205, 206; 305, and electrically conducting vias 109, 110; 209, 210; 309 that run in the dielectric material structure 105, 106; 205, 206; 305 and form a wall structure that runs perpendicular to the bottom layer 107, 108; 207, 208; 307.

According to some aspects, the metasurfaces 101, 102; 201, 202 are positioned such that opposing electrically conducting structures 103, 104; 203, 204 face each other, providing mirror symmetry.

According to some aspects, the metasurfaces 101, 102; 201, 202; 301, 302 are positioned such that opposing electrically conducting structures 103, 104; 203, 204; 303, 304 are laterally displaced with respect to each other such that a glide-symmetric metasurface arrangement 100', 200', 300 is formed.

The invention claimed is:

1. A metasurface arrangement comprising a first metasurface and a second metasurface which run mutually parallel and face each other, each metasurface comprising a corresponding periodic or quasi-periodic structure in a respective pattern, wherein the first metasurface is in a dielectric material structure and the second metasurface is in either a dielectric material structure or in an electrically conducting structure, wherein:
   the periodic or quasi-periodic structure on the first metasurface is configured to yield a first response to an incident electromagnetic wave between the two metasurfaces, and the periodic or quasi-periodic structure on the second metasurface is configured to yield a second response to the incident electromagnetic wave between the two metasurfaces that is equivalent to the first response, thereby rendering the two metasurfaces mutually electromagnetically symmetric, and
   the second metasurface comprises a second periodic or quasi-periodic structure, where each periodic or quasi-periodic structure of the first and second metasurfaces have mutually different geometries rendering the first and second metasurfaces mutually electromagnetically symmetric.

2. The metasurface arrangement according to claim 1, wherein there is a distance (h) between the metasurfaces.

3. The metasurface arrangement according to claim 1, wherein the metasurfaces are in dielectric materials having the same conducting properties or wherein the first metasurface is in a first material and the second metasurface is in a second material, where the first material and the second material have mutually different conducting properties.

4. The metasurface arrangement according to claim 1, wherein the first metasurface is in a first material and the second metasurface is in a second material, where the first material and the second material have mutually different conducting properties.

5. The metasurface arrangement according to claim 1, wherein each metasurface comprises a corresponding set of mutually identical electrically conducting structures in the corresponding periodic or quasi-periodic structure.

6. The metasurface arrangement according to claim 1, wherein each periodic or quasi-periodic structure comprises electrically conducting structures.

7. The metasurface arrangement according to claim 6, wherein the electrically conducting structures comprise three-dimensional cavities.

8. The metasurface arrangement according to claim 7, wherein each three-dimensional cavity has a circular or a rectangular cross-section.

9. The metasurface arrangement according to claim 7, wherein each cavity that is in a dielectric material structure and comprises an electrically conducting bottom layer that is parallel to a main lateral extension of the dielectric material structures, and electrically conducting vias that run in the dielectric material structure and a wall structure that runs perpendicular to the bottom layer.

10. The metasurface arrangement according to claim 5, wherein the metasurfaces are positioned such that opposing electrically conducting structures face each other, providing minor symmetry.

11. The metasurface arrangement according to claim 5, wherein the metasurfaces are positioned such that opposing electrically conducting structures are laterally displaced with respect to each other such that a glide-symmetric metasurface arrangement is formed.

12. A method for providing a metasurface arrangement, the method comprising:
- providing a first metasurface by providing a first periodic or quasi-periodic structure in a first pattern in a dielectric material;
- providing a second metasurface by providing a second periodic or quasi-periodic structure in a second pattern in either a dielectric material or a metallic material;
- positioning the metasurfaces such that they run mutually parallel and face each other; and
- configuring the corresponding periodic or quasi-periodic structure for each metasurface such that a first response to an incident electromagnetic wave between the two metasurfaces is obtained for the first metasurface, and a second response to the incident electromagnetic wave between the two metasurfaces is obtained for the second metasurface, where the second response is equivalent to the first response, thereby rendering the two metasurfaces mutually electromagnetically symmetric,
- wherein configuring a corresponding periodic or quasi-periodic structure comprises providing, for each metasurface, a corresponding set of mutually identical electrically conducting structures, and the electrically conducting structures are in the form of three-dimensional cavities.

13. The method according to claim 12, wherein positioning the metasurfaces comprises providing a distance (h) between the metasurfaces.

14. The method according to claim 12, wherein the metasurfaces are in dielectric materials having the same conducting properties or wherein the first metasurface is in a first material and the second metasurface is in a second material, wherein the first material and the second material have mutually different conducting properties.

15. The method according to claim 12, wherein each periodic or quasi-periodic structure is with mutually different geometries, rendering the two metasurfaces mutually electromagnetically symmetric.

16. The method according to claim 12, wherein each three-dimensional cavity has a circular or a rectangular cross-section.

17. The method according to claim 12, wherein positioning the metasurfaces comprises positioning the metasurfaces such that opposing electrically conducting structures face each other, providing mirror symmetry.

18. The method according to claim 12, wherein positioning the metasurfaces comprises positioning the metasurfaces such that opposing electrically conducting structures are laterally displaced with respect to each other such that a glide-symmetric metasurface arrangement is formed.

19. A metasurface arrangement comprising a first metasurface and a second metasurface which run mutually parallel and face each other, each metasurface comprising a corresponding periodic or quasi-periodic structure in a respective pattern, wherein the first metasurface is in a dielectric material structure and the second metasurface is in either a dielectric material structure or in an electrically conducting structure, wherein:
- the periodic or quasi-periodic structure on the first metasurface is configured to yield a first response to an incident electromagnetic wave between the two metasurfaces, and the periodic or quasi-periodic structure on the second metasurface is configured to yield a second response to the incident electromagnetic wave between the two metasurfaces that is equivalent to the first response, thereby rendering the two metasurfaces mutually electromagnetically symmetric, and
- each metasurface comprises a corresponding set of mutually identical electrically conducting structures in the corresponding periodic or quasi-periodic structure, and the metasurfaces are positioned such that opposing electrically conducting structures are laterally displaced with respect to each other such that a glide-symmetric metasurface arrangement is formed.

\* \* \* \* \*